United States Patent
Dunn et al.

(10) Patent No.: US 7,605,048 B2
(45) Date of Patent: Oct. 20, 2009

(54) METHOD FOR FORMING A CAPACITOR HAVING A COPPER ELECTRODE AND A HIGH SURFACE AREA ALUMINUM INNER LAYER

(75) Inventors: Gregory J. Dunn, Arlington Heights, IL (US); Jovica Savic, Downers Grove, IL (US); Philip M. Lessner, Newberry, SC (US); Albert K. Harrington, Fountain Inn, SC (US)

(73) Assignees: Kemet Electronics Corporation, Greenville, SC (US); Motorola, Inc., Shamburg, IL (US)

( * ) Notice: Subject to any disclaimer, the term of this patent is extended or adjusted under 35 U.S.C. 154(b) by 388 days.

(21) Appl. No.: 11/697,477

(22) Filed: Apr. 6, 2007

(65) Prior Publication Data

US 2008/0244885 A1  Oct. 9, 2008

(51) Int. Cl.
*H01L 21/20* (2006.01)
*H01G 4/228* (2006.01)

(52) U.S. Cl. ............... 438/381; 438/250; 257/E21.011; 257/E21.012; 257/E21.021; 361/306.3; 361/322

(58) Field of Classification Search .......... 438/381, 438/250; 257/E21.011, E21.012, E21.021; 361/306.3, 322
See application file for complete search history.

(56) References Cited

U.S. PATENT DOCUMENTS

| | | | |
|---|---|---|---|
| 4,482,931 A | 11/1984 | Yializis | |
| 6,187,061 B1 | 2/2001 | Amatucci et al. | |
| 6,346,335 B1 | 2/2002 | Chen et al. | |
| 6,534,133 B1 | 3/2003 | Kaloyeros et al. | |
| 6,540,900 B1 | 4/2003 | Kinard et al. | |
| 6,605,314 B2 | 8/2003 | Lessner et al. | |
| 6,744,621 B2 | 6/2004 | Lessner et al. | |
| 6,808,615 B2 | 10/2004 | Lessner et al. | |
| 6,839,219 B2 * | 1/2005 | Mashiko et al. | 361/311 |
| 6,882,544 B2 | 4/2005 | Nakamura et al. | |
| 7,361,568 B2 * | 4/2008 | Dunn et al. | 438/381 |
| 2004/0256731 A1 | 12/2004 | Mao et al. | |
| 2005/0150596 A1 | 7/2005 | Vargo et al. | |
| 2005/0217893 A1 | 10/2005 | Noguchi et al. | |
| 2006/0120014 A1 | 6/2006 | Nakamura et al. | |

FOREIGN PATENT DOCUMENTS

WO   2006091462 A2   8/2006

OTHER PUBLICATIONS

PCT International Search Report, PCT Appl. PCT/US2008/058555, Sep. 10, 2008.

* cited by examiner

*Primary Examiner*—Long K Tran
(74) *Attorney, Agent, or Firm*—John B. Hardaway, III; Nexsen Pruet, LLC

(57) ABSTRACT

High capacitance value capacitors are formed using bimetal foils of an aluminum layer attached to a copper layer. The copper side of a bimetallic copper/aluminum foil or a monometallic aluminum foil is temporarily protected using aluminum or other materials, to form a sandwich. The exposed aluminum is treated to increase the surface area of the aluminum by at least one order of magnitude, while not attacking any portion of the protected metal. When the sandwich is separated, the treated bimetal foil is formed into a capacitor, where the copper layer is one electrode of the capacitor and the treated aluminum layer is in intimate contact with a dielectric layer of the capacitor.

50 Claims, 9 Drawing Sheets

METHOD FOR FORMING A CAPACITOR HAVING A COPPER ELECTRODE AND A HIGH SURFACE AREA ALUMINUM INNER LAYER

RELATED APPLICATIONS

This application is related to U.S. application Ser. No. 11/316,087 filed on Dec. 21, 2005, entitled: EMBEDDED CAPACITORS AND METHOD FOR THEIR FABRICATION and assigned to the assignees hereof.

FIELD OF THE INVENTION

The present invention generally relates to multi-layer foils suitable for making either discrete capacitors or capacitors that are embedded in rigid or flexible circuit boards.

BACKGROUND

In the electronics art, smaller often means better. In the quest to provide smaller electronic appliances, the electronics industry seeks electronic components that are smaller than predecessor components. The capacitor (a dielectric material sandwiched between two conductors) represents one electronic component that has substantially shrunk in this quest. However, current practice relies largely on individually mounting and soldering discrete surface mount capacitors onto the surface of printed circuit boards. Despite the advances in capacitor miniaturization, each surface mounted capacitor still occupies a significant fraction of the circuit board surface area, and requires substantial cost to place and solder onto the board. For example, a typical cellular telephone contains over 200 surface mounted capacitors connected to the circuit board by over 400 solder joints. The ability to integrate or embed capacitors in circuit boards during manufacture of the circuit boards would provide substantial space and cost savings over surface mounted capacitors. Unfortunately, efforts to make capacitors that can be integrated or embedded into circuit boards have produced capacitors that have small capacitance (typically less than 10 picofarad/$mm^2$) and thus can only replace a small percentage of the capacitors, as most need to be larger than 100 picofarad/$mm^2$.

Other efforts have resulted in structures and processes that are not amenable to the needs of high performance circuitry. Printed circuit boards typically contain multiple layers of copper sandwiched between a glass-reinforced polymer. The copper is patterned to form the conducting elements of the circuit, and the polymer provides dielectric isolation and mechanical robustness. Since polymers are inherently low dielectric constant materials, parallel plate embedded capacitors formed within the conventional polymer circuit board do not offer high enough capacitance density. Although very high dielectric constant ceramics are available, they are typically too rigid to be mechanically compatible with organic printed circuit boards.

BRIEF DESCRIPTION OF THE FIGURES

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

Figure 1:
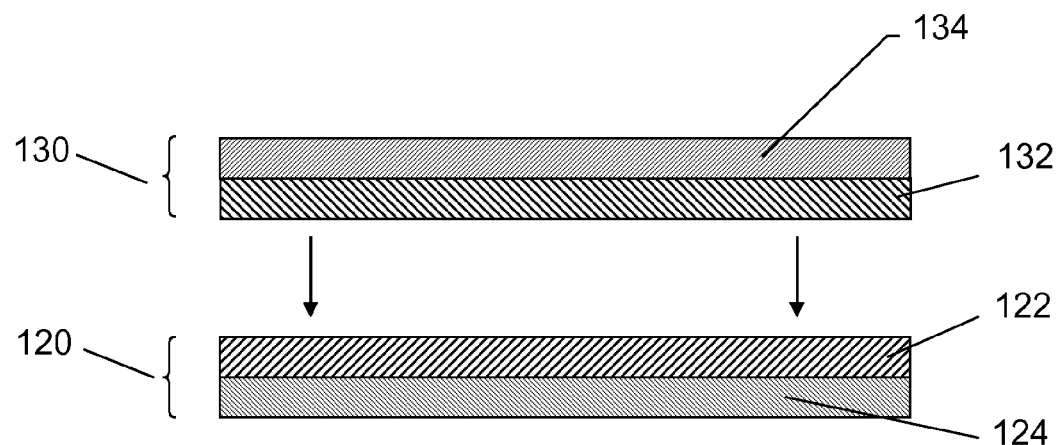
FIG. 1 is a cross sectional view depicting two bimetal foils prior to attaching, in accordance with some embodiments of the invention.

Skilled artisans will appreciate that elements in the figures are illustrated for simplicity and clarity and have not necessarily been drawn to scale, or to the same scale. For example, the dimensions of some of the elements in the figures may be exaggerated relative to other elements to help to improve understanding of embodiments of the present invention.

DETAILED DESCRIPTION

Before describing in detail embodiments that are in accordance with the present invention, it should be observed that the embodiments reside primarily in combinations of method and apparatus components related to the formation of high capacitance discrete and embedded capacitors. Accordingly, the apparatus components and methods have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

It will be appreciated that embodiments of the invention described herein may be comprised of one or more conventional and unique processes that provide methods of forming capacitors. Further, it is expected that one of ordinary skill, notwithstanding possibly significant effort and many design choices motivated by, for example, available time, current technology, and economic considerations, when guided by the concepts and principles disclosed herein will be readily capable of replicating the methods with minimal experimentation.

High capacitance value capacitors that have a high surface area aluminum layer supported by a copper backing are formed using bimetal foils consisting of an aluminum layer attached to a copper layer. Two foils are temporarily attached together to form a sandwich, so that the two copper layers face each other on the inside of the sandwich and the two aluminum layers are on the outside, sufficient to protect the copper layers from attack in a subsequent treatment. The exposed aluminum layers of the sandwich are then processed with a treatment such as wet chemical etching, laser etching, plasma etching, or chemical vapor deposition that increases the surface area of each of the aluminum layers by at least one order of magnitude, and does not reveal any portion of the underlying copper layers. When the two bimetal foils are separated, each treated bimetal foil can then be used to form a capacitor, where the copper layer is one electrode of the capacitor and the treated aluminum layer is in intimate contact with a dielectric layer of the capacitor.

Figure 2:
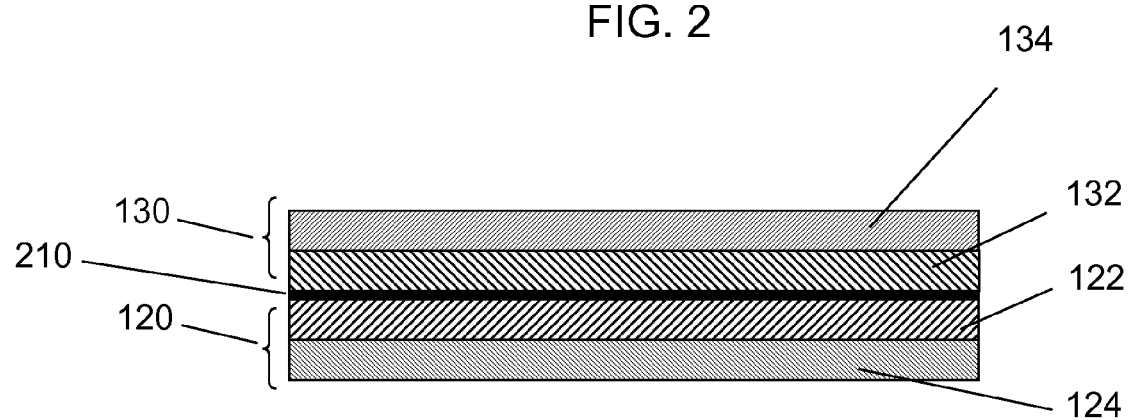
FIG. 2 is a cross sectional view of the bimetal foils of FIG. 1 after attaching, in accordance with some embodiments of the invention.

Referring now to FIG. 1, a first bimetal foil 120 consisting of a copper support layer 122 bonded to a conductive aluminum layer 124 is formed. The bimetal foil in this case is of a size useful for fabricating multilayer printed circuit boards, with a typical minimum width and length of 25 cm and a typical maximum width and length of 61 cm, although other sizes may be practical. A second bimetal foil 130 that is a duplicate of the first bimetal foil is also formed. The two bimetal foils are joined together to form a sandwich so that each of the copper support layers 122, 132 faces the other one on the inside of the sandwich, and the aluminum layers 124, 134 are on the outside of the sandwich, as shown in FIG. 2. Optionally, a release layer 210 (or interface) can be provided between the two bimetal foils 120, 130 to hold them together temporarily, so that the two bimetal foils can be separated at a later stage. The release layer is a material that provides enough adhesion between the two copper layers to bind the foils together during processing, but will also allow the two bimetal foils to be separated from each other (i.e. released) when desired. Both characteristics of the release layer are important, and adhesion must be balanced against release, so that the foils are tightly sealed during treatment, but will separate cleanly when needed. Such release layers are known in the art and include both organic and inorganic types. For example, the release layer 210 may consist essentially of a co-deposited admixture of a metal and a non-metal, and may be formed using known techniques such as those described in U.S. Pat. No. 6,346,335, B1 issued to Chen et al. on Feb. 12, 2002. Some examples of a release layer are: chromium and chromium oxide, nickel and nickel oxide, chromium and chromium phosphate, nickel and nickel phosphate, and nickel and nickel chromate. This arrangement of the sandwich of the two bimetal foils serves to protect the inner copper layers from attack when the sandwich is exposed to a treatment process where the outer aluminum layers are converted to create a very high surface area layer. Optionally, the arrangement of the sandwich can also protect the copper layers from chemical or electrochemical attack in later stages of processing (e.g., during anodization to form the dielectric), Typically, these treatment processes are very aggressive, and the copper is not compatible with the processes. If the copper is not protected, it too, will be treated, and may weaken significantly, or disappear altogether, and since the copper layers 122, 132 provide support for the high surface area aluminum layers 124, 134 in later processing stages, it is important to protect the copper layers from attack.

In accordance with one embodiment of the present invention, the copper support layers 122, 132 are typically 5 micrometers in thickness, but may range from 1-70 micrometers. The conductive aluminum layers 124, 134 are typically 20 micrometers thick, but may range from 10-110 micrometers. The release layer 210 may be about 0.030 micrometers thick. Because the present invention ultimately is for fabrication of discrete capacitors or capacitors integrated in a layer or layers of multilayer printed circuit boards, the support layers 122, 132 of the present invention are normally copper or a copper alloy.

Figure 3:
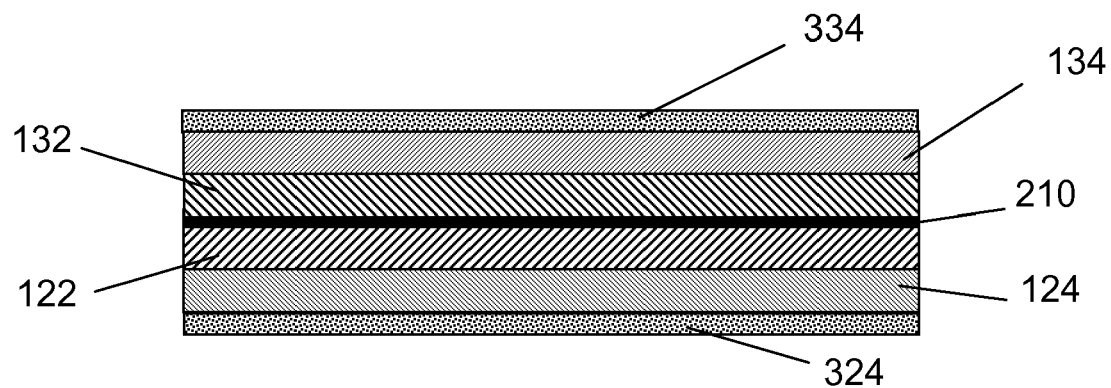
FIG. 3 is a cross sectional view of the bimetal foils of FIG. 2 after treating the aluminum surfaces, in accordance with some embodiments of the invention.

Referring now to FIG. 3, the exposed aluminum layers 124, 134 of the sandwich are then treated by wet chemical or electrochemical wet etching, laser etching, plasma etching, or chemical vapor deposition in order to increase the surface area of each of the exposed aluminum layers by at least one order of magnitude. Since the inner copper support layers 122, 132 are protected by the outer aluminum layers 124, 134, and also by the release layer 210, the aggressive treatment process does not reveal any portion of the underlying copper layers. Obviously, one must control the parameters of the treatment process so as not to completely deplete the aluminum layer and begin attacking the copper layer, else the process will be ineffective. Conventional etching techniques such as selective wet chemical or electrochemical wet etching may be used to etch the exposed side of the aluminum, without substantially affecting the copper layer, to achieve such high surface area. Thus, the etching is performed substantially only on the exposed side of the layer of aluminum. The high surface area texture 324, 334 has a surface area gain, defined as surface area of the texture divided by the surface area of a flat surface of equivalent dimensions. The surface area gain is at least 10 (i.e., one order of magnitude) and typically may be much larger, such as 100 or more (i.e., two orders of magnitude or more). The treatment process alters the smooth aluminum surface such that cavities are formed in the aluminum layer that extend into the aluminum layer to a depth equal to 50-95% of the original thickness of the aluminum layer. We find that when the original smooth aluminum layer is 20 micrometers thick, the optimum cavity depth is about 15-19 micrometers, with a nominal depth of about 17 micrometers. One electrochemical wet etching technique that we find useful is hydrochloric acid with a superimposed alternating current (AC) or direct current (DC) bias. We find that the highest gain surfaces are achieved using AC as opposed to DC bias. Another treatment technique to achieve high surface area is chemical vapor deposition (CVD). CVD is not, strictly speaking, an etching process, but more of an additive process, thus we refer here to the process of increasing the surface area of the aluminum layer as a 'treatment' so as to include both subtractive and additive techniques.

Figure 4:
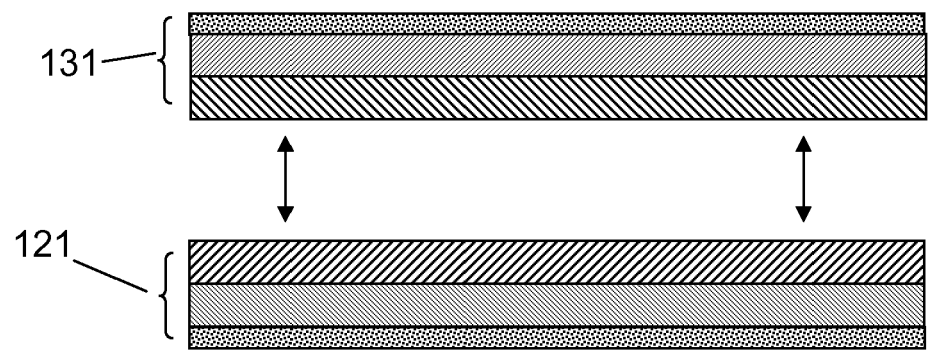
FIG. 4 is a cross sectional view of the bimetal foils of FIG. 3 after separating, in accordance with some embodiments of the invention.
Figure 5:
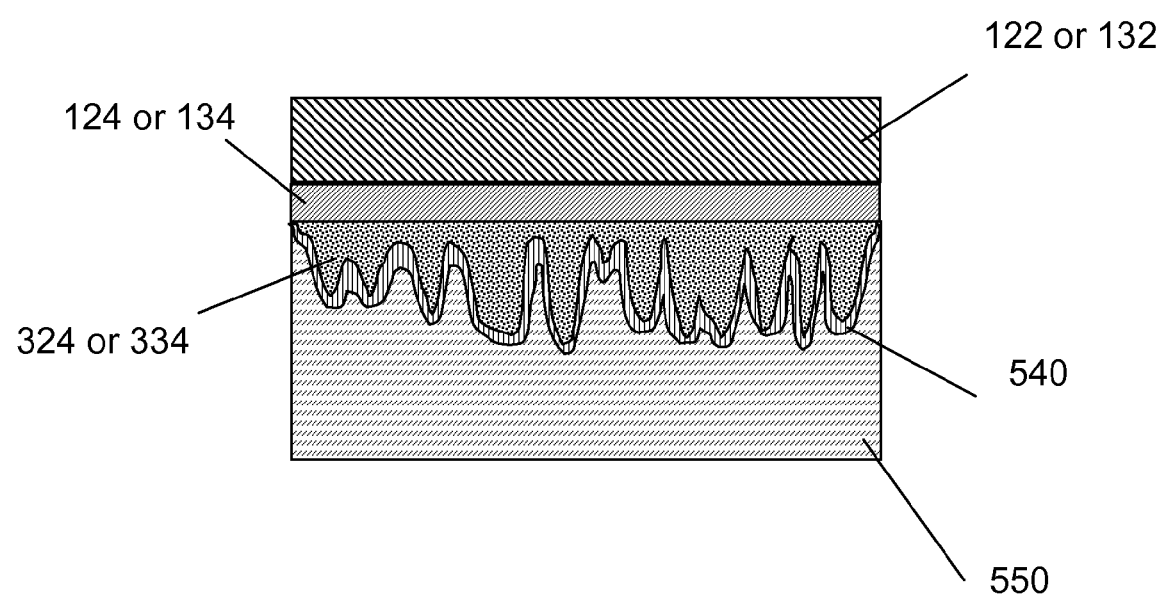
FIG. 5 is a cross sectional view of a capacitor, in accordance with some embodiments of the invention.
Figure 6:
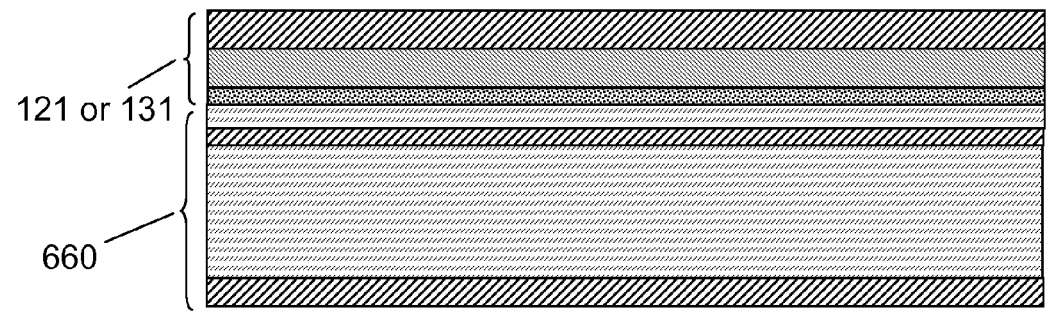
FIG. 6 depicts cross sectional views of some stages in forming a printed circuit board having embedded capacitors, in accordance with some embodiments of the invention.
Figure 6:
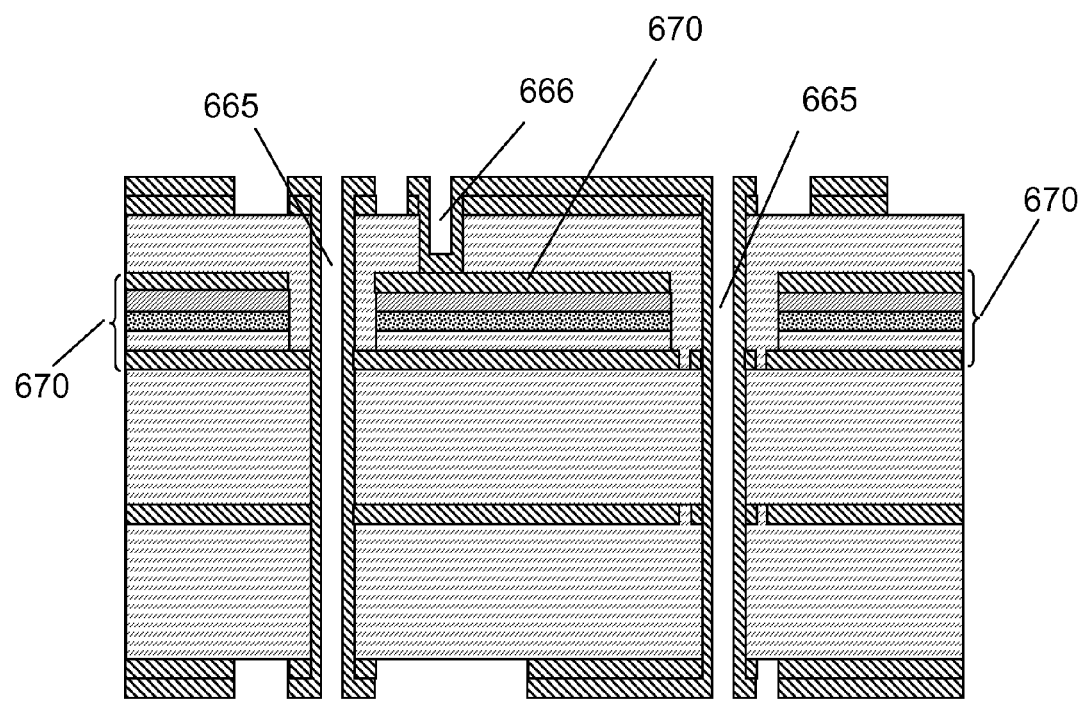

Referring now to FIG. 4, the two treated bimetal foils 121, 131 are separated at the releasable interface to yield two identical bimetal foils each having a high surface area aluminum surface. Each of these treated bimetal foils can now be used to form capacitors, as shown in FIG. 5, where the copper support layer 122 or 132 serves as one electrode, the high surface area treated aluminum layer (124 and 324 or 134 and 334) is in intimate contact with the dielectric material 540 of the capacitor. The dielectric material 540 can be formed by anodizing the high surface area aluminum to form aluminum oxide, or by coating another dielectric on the high surface area aluminum. Examples of other dielectrics would be barium titanate or a non-conductive polymeric material. Optionally, the two treated bimetal foils can be separated after the dielectric is formed or deposited, if it is desired to protect the copper surfaces during the dielectric formation or deposition. A second electrode 550 is subsequently added in another process. This second electrode 550 may comprise a single conductive layer or a plurality of conductive layers. The second electrode 550 ideally comprises a copper layer to facilitate integration in a printed circuit board, in which copper layers are conventional. For example, second electrode 550 may comprise layers of polyethylene dioxythiophene (PEDT), carbon-filled polymer, silver-filled polymer, and copper metal. Capacitors formed using the process described herein may be used to form discrete capacitors or capacitors that are embedded into a printed circuit board. When forming discrete capacitors, one can add the dielectric layer 540 to one of the separated foils, along with the second electrode 550, and excise a portion of this structure to provide a discrete capacitor that can be surface mounted to a printed circuit board. Referring now to FIG. 6, each of the separated foils 121, 131 can alternatively be laminated into a printed circuit board to produce embedded capacitors. The treated bimetal foil 121 or 131 is laminated onto a stack 660 that contains at least a prepreg layer and a layer of copper foil. The stack may, of course, contain additional layers of polymer and copper, arranged in various orders, as is known in the art to form multilayer circuit boards. Other arrangements are also implied, for example the treated bimetal foil can be laminated to a copper clad core by sandwiching a layer of prepreg between the treated bimetal foil and the copper clad core. The laminated stack is then patterned in a conventional manner, and through vias 665 and blind vias 666 can be formed in conventional fashion to yield a multilayer printed circuit board with high capacitance value embedded capacitors 670.

Figure 7:
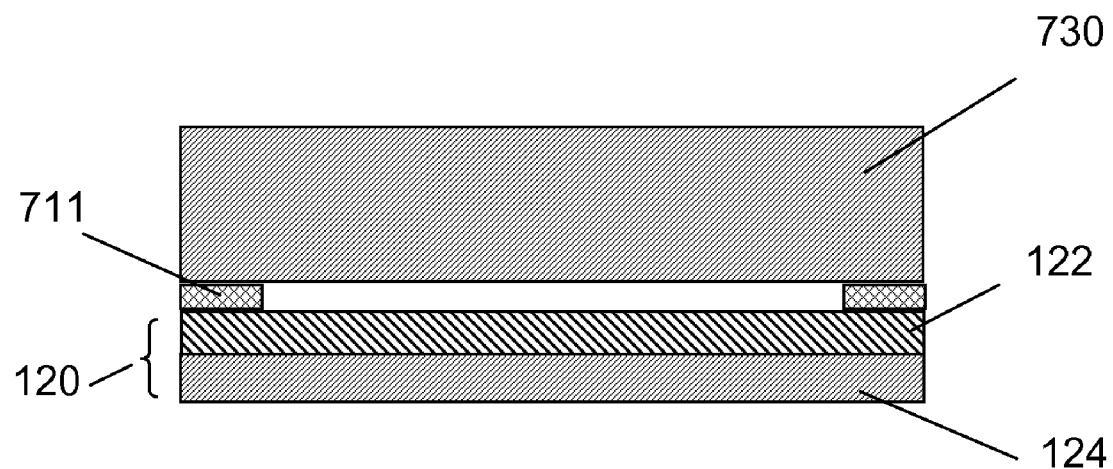
FIG. 7 is a cross sectional view of a bimetal foil attached to a sacrificial aluminum carrier, in accordance with some embodiments of the invention.

In another embodiment of our invention depicted in FIG. 7, a bimetal foil 120 consisting of a copper support layer 122 bonded to a conductive aluminum layer 124 is formed. A sacrificial aluminum carrier foil 730 is temporarily attached to the bimetal foil 120 to form a sandwich so that the copper support layer 122 is on the inside of the sandwich, and the aluminum layers 124, 730 are on the outside of the sandwich. Both the bimetal foil and the aluminum carrier are of a size useful for fabricating multilayer printed circuit boards, with a typical minimum width and length of 25 cm and a typical maximum width and length of 61 cm, although other sizes may be practical. The sacrificial aluminum carrier foil may be attached to the bimetal foil across the entire surface using an adhesive 711, or only at selected portions, such as the perimeter, by, for example, welding or coining the perimeter. It may also be attached as previously described, using an optional release layer (or interface) situated between the bimetal foil 120 and the sacrificial aluminum carrier 730 to temporarily hold them together, so that the two can be separated at a later stage. Some examples of a release layer are: chromium and chromium oxide, nickel and nickel oxide, chromium and chromium phosphate, nickel and nickel phosphate, and nickel and nickel chromate. This arrangement of the sandwich serves to protect the inner copper layer from attack when the sandwich is exposed to a treatment process where the outer aluminum layer 124 is converted to create a very high surface area. Typically, this treatment process is very aggressive, and the copper is not compatible with the process. If the copper is not protected, it too, will be treated, and may weaken significantly, or disappear altogether, and since the copper layer 122 provides support for the high surface area aluminum layer 124 in later processing stages, it is important to protect the copper from attack.

Figure 8:
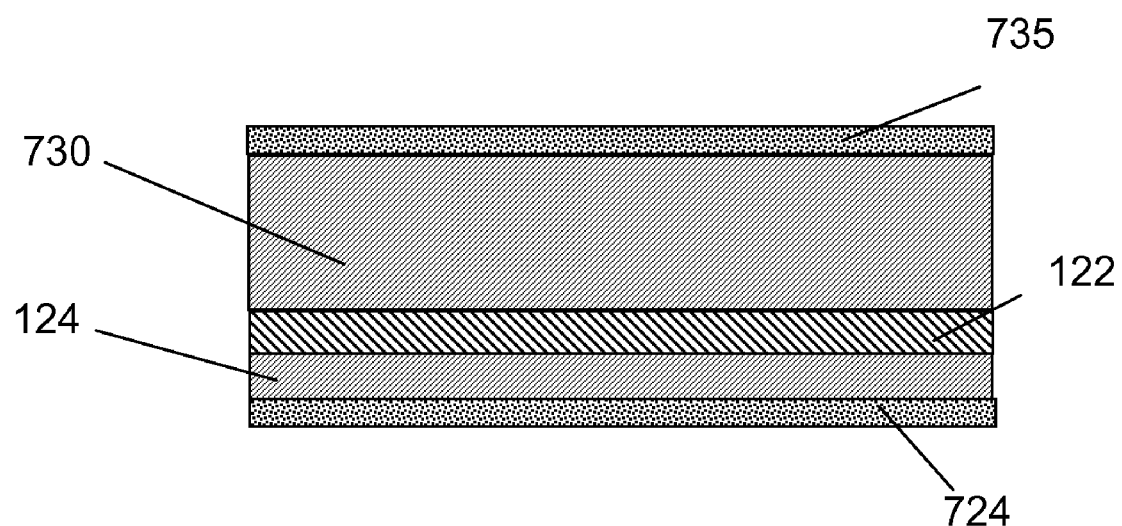
FIG. 8 is a cross sectional view of the assembly of FIG. 7 after treating the aluminum surfaces, in accordance with some embodiments of the invention.

In accordance with one embodiment of the present invention, the copper support layer 122 is typically 5 micrometers in thickness, but may range from 1-70 micrometers. The aluminum layer 124 is typically 20 micrometers thick, but may range from 10-110 micrometers. The sacrificial aluminum carrier foil 730 is typically much thicker than either of the layers in the bimetal foil, and we find that thicknesses greater than two (2) times the thickness of the bimetal foil 120 are suitable. Referring now to FIG. 8, the exposed aluminum layers 124, 730 of the sandwich are then treated by wet chemical etching, electrochemical wet etching, laser etching, plasma etching, or chemical vapor deposition in order to increase the surface area of the exposed aluminum layer 124 by at least one order of magnitude. Since the inner copper support layer 122 is protected by the outer aluminum layers 124, 730, and also by the optional adhesive layer 711 or release layer 210, the aggressive treatment process does not reveal any portion of the underlying copper layers. During this treatment stage, the outer surface 735 of the sacrificial aluminum carrier 730 will also be altered, but this is a moot point, since the carrier 730 serves only to protect the copper support layer 122 from attack, thus our use of the term 'sacrificial'. Obviously, one must control the parameters of the treatment process so as not to completely deplete the aluminum layer and begin attacking the copper layer, else the process will be ineffective. Conventional etching techniques such as selective wet chemical or electrochemical wet etching may be used to etch the exposed side of the aluminum, without substantially affecting the copper layer, to achieve such a high surface area. Thus, the etching is performed substantially only on the exposed side of the layer of aluminum. The high surface area texture 724 has a surface area gain at least 10 (i.e., one order of magnitude) and typically may be much larger, such as 100 or more (i.e., two orders of magnitude or more). The treatment process alters the smooth aluminum surface such that cavities are formed in the aluminum layer that extend into the aluminum layer to a depth equal to 50-95% of the original thickness of the aluminum layer. We find that when the original smooth aluminum layer is 20 micrometers, the optimum cavity depth is about 15-19 micrometers, with a nominal depth of about 17 micrometers.

One electrochemical wet etching technique that we find useful is hydrochloric acid with a superimposed alternating current (AC) or direct current (DC) bias. We have found that the highest gain surfaces are achieved using AC as opposed to DC bias. Another treatment technique to achieve high surface area is chemical vapor deposition (CVD). CVD is not, strictly speaking, an etching process, but more of an additive process, thus we refer here to the process of increasing the surface area of the aluminum layer as a 'treatment' so as to include both subtractive and additive techniques.

The high surface area aluminum formed using the process described herein may be used to form discrete capacitors or capacitors that are embedded into a printed circuit board. Referring now to FIG. 6, the treated sandwich can be laminated onto a stack 660 that contains at least a prepreg layer and a layer of copper foil. The stack may, of course, contain additional layers of polymer and copper, arranged in various orders, as is known in the art to form multilayer circuit boards. Other arrangements are also implied, for example the treated sandwich can be laminated to a copper clad core by sandwiching a layer of prepreg between the treated sandwich and the copper clad core. The laminated stack is then patterned in a conventional manner, and through vias 665 and blind vias 666 can be formed in conventional fashion to yield a multilayer printed circuit board with high capacitance value embedded capacitors 670.

After lamination, the sacrificial aluminum carrier 730 (FIG. 7) is removed and discarded using one or more of several means, depending on how the carrier was attached to the bimetal foil. If the carrier was attached by means of an adhesive or by welding or coining around the perimeter, then the adhered portion can simply be trimmed off. If the adhesive was across the entire surface, or if no adhesive was used but rather the carrier was clad directly to the copper layer, then the carrier can be etched off using wet chemical processing. If a release layer was used, then the carrier can be removed by peeling. The laminated prepreg 660 and treated aluminum/copper bimetal 121, 131 is then patterned in conventional manner, and through vias 665 and blind vias 666 are further formed in conventional fashion to yield a multilayer printed circuit board with high capacitance value embedded capacitors 670. When forming discrete capacitors, one can add a dielectric layer to the bimetal foil, along with a second electrode, and excise a portion of this structure to provide a discrete capacitor that can be surface mounted to a printed circuit board.

Figure 9:
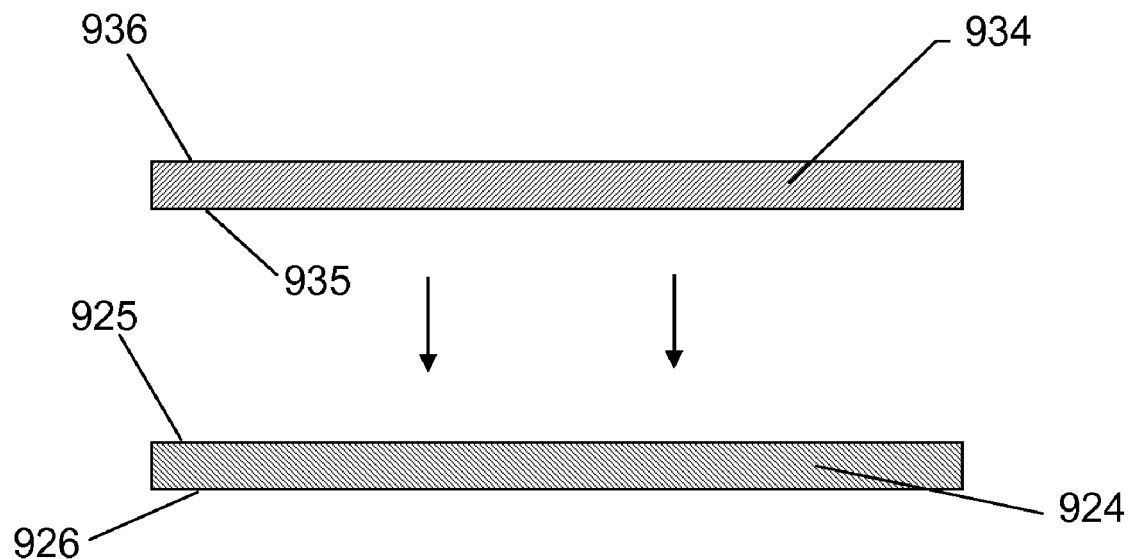
FIG. 9 is a cross sectional view of two aluminum foils prior to attaching, in accordance with some embodiments of the invention.

In another embodiment of our invention depicted in FIG. 9, two aluminum foils 924, 934 are arranged so that first major surfaces 925, 935 of each foil face each other. The two aluminum foils 924, 934 are temporarily joined together to form a sandwich so that second major surfaces 926, 936 of each of the foils are exposed on the outside of the sandwich, and the first major surfaces 925, 935 are on the inside of the sandwich. The two aluminum foils may be attached across the entire surface using a weak adhesive or a temporary releasing interface, or only at selected portions, such as the perimeter, by adhesive bonding, welding, or coining, etc. The attaching means used to temporarily hold the foils together is intentionally not depicted the figure, as any number of conventional attachment methods can be used, so long as the two foils can be cleanly separated at a later stage. This arrangement of the sandwich serves to protect the first major surfaces 925, 935 from attack when the sandwich is exposed to a treatment process where the second major surfaces 926, 936 are converted to create a very high surface area.

Figure 10:
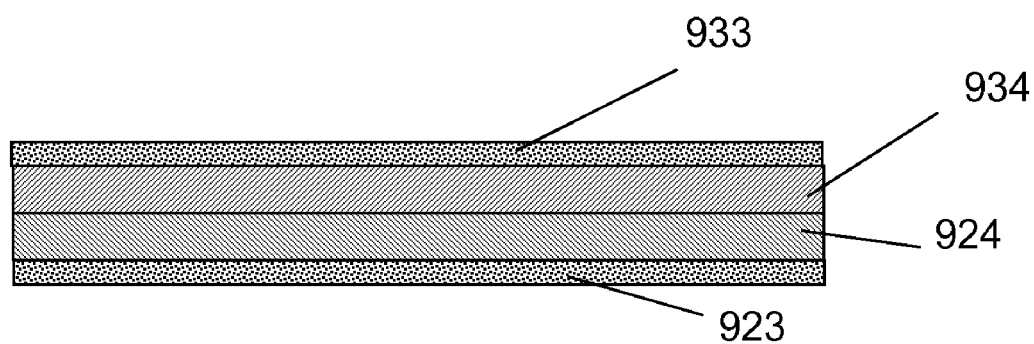
FIG. 10 is a cross sectional view of the attached foils of FIG. 9, after treating the aluminum surfaces, in accordance with some embodiments of the invention.

Referring now to FIG. 10, the exposed second major surfaces of the aluminum foils 924, 934 comprising the sandwich are then treated by wet chemical etching, electrochemical wet etching, laser etching, plasma etching, or chemical vapor deposition in order to increase the surface area of the exposed aluminum by at least one order of magnitude. Since the first major surfaces are sealed inside the sandwich, the etching is performed only on the exposed side of the aluminum foils, and any edges. The high surface area texture 923, 933 has a surface area gain of at least 10 (i.e., one order of magnitude) and typically may be much larger, such as 100 or more (i.e., two orders of magnitude or more). The treatment process alters the smooth aluminum surface such that cavities are formed in the aluminum foils that extend into the aluminum to a depth equal to 50-95% of the original thickness of the aluminum foils. We find that when the original smooth aluminum foils are 20 micrometers, the optimum cavity depth is about 15-19 micrometers, with a nominal depth of about 17 micrometers.

Figure 11:
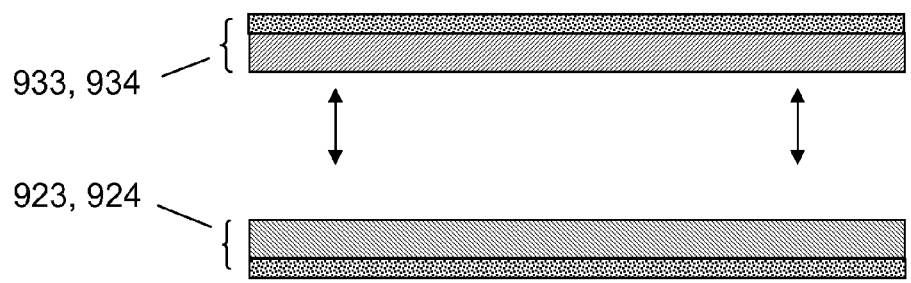
FIG. 11 is a cross sectional view of the treated foils of FIG. 10, after separating, in accordance with some embodiments of the invention.
Figure 12:
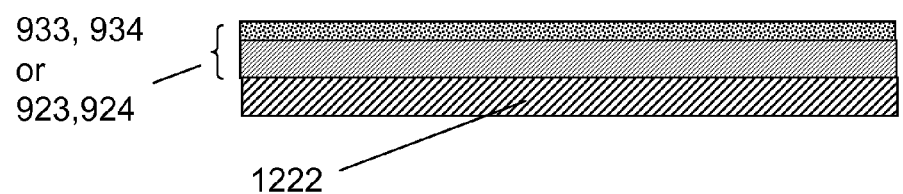
FIG. 12 is a cross sectional view of the separated foil of FIG. 11, after plating with copper, in accordance with some embodiments of the invention.

Referring now to FIG. 11, the two treated aluminum foils 923, 924, 933, 934 are separated from each other at the temporarily joined first major surfaces. This can be accomplished in a number of ways, depending on how the foils were attached in the previous stage. If a weak adhesive or release layer was used, then the treated foils can simply be peeled apart. If they were joined at the perimeter, for instance, then the bonded perimeter area can be excised from the sandwich and discarded. Referring now to FIG. 12, a layer of copper 1222 plated on either or both of the treated, separated foils, on the foil first surface that was protected on the inside of the sandwich. Since the first surface was protected from attack during the treatment stage, it remains smooth and will yield a smooth plated surface. This copper layer 1222 will ultimately serve as one electrode of the capacitor. The high surface area aluminum formed using this embodiment may be used to form discrete capacitors or capacitors that are embedded into a printed circuit board, as shown in FIG. 5, where the copper support layer 122 or 132 serves as one electrode, and the high surface area treated aluminum layer (124 and 324 or 134 and 334) is in intimate contact with the dielectric material 540 of the capacitor. The dielectric material 540 can be formed by anodizing the high surface area aluminum to form aluminum oxide, or by depositing another dielectric such as barium titanate or a non-conductive polymeric material on the high surface area aluminum. A second electrode 550 is subsequently added in another process. This second electrode 550 may comprise a single conductive layer or a plurality of conductive layers. The second electrode 550 ideally comprises a copper layer to facilitate integration in a printed circuit board, in which copper layers are conventional. For example, second electrode 550 may comprise layers of polyethylene dioxythiophene (PEDT), carbon-filled polymer, silver-filled polymer, and copper metal. Capacitors formed using the process described herein may be used to form discrete capacitors or capacitors that are embedded into a printed circuit board. When forming discrete capacitors, one can add the dielectric layer 540 to one of the separated foils, along with the second electrode 550, and excise a portion of this structure to provide a discrete capacitor that can be surface mounted to a printed circuit board.

Figure 13:
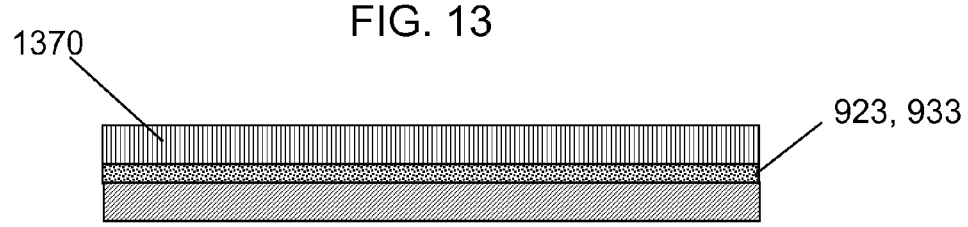
FIG. 13 is a cross sectional view of the separated foil of FIG. 11, after protecting the treated surface with a protective layer, in accordance with some embodiments of the invention.
Figure 14:
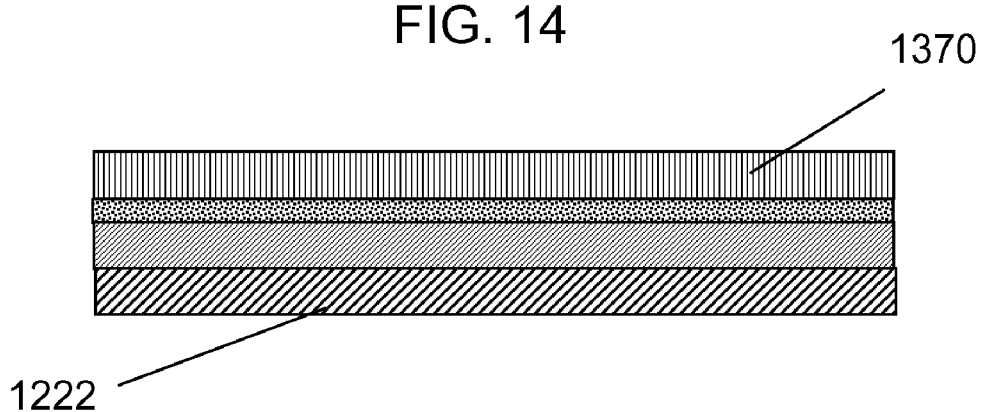
FIG. 14 is a cross sectional view of the protected foil of FIG. 13, after plating with copper, in accordance with some embodiments of the invention.
Figure 15:
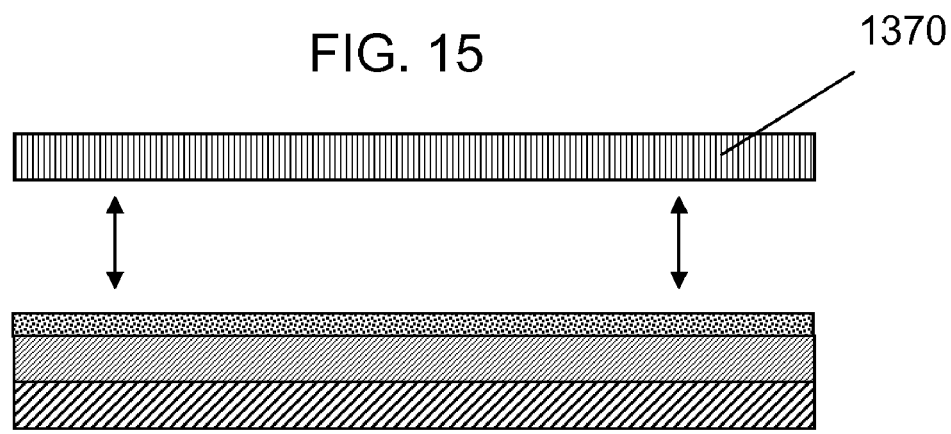
FIG. 15 is a cross sectional view of the plated foil of FIG. 14, after separating the protective layer, in accordance with some embodiments of the invention.

Referring now to FIG. 13, an alternate embodiment of this process is to add a protective layer 1370 to the treated second surface 923, 933 so as to prevent copper deposition on the treated second surface during plating. The protective layer can be another layer of aluminum or other metal, an elastomer, a polymer, or a mask, and if needed, can be attached, for example, by perimeter joining as in previous embodiments, or by vacuum or pressure. Referring now to FIG. 14, a layer of copper 1222 is plated on either or both of the treated, protected foils, on the foil first surface that was on the inside of the sandwich. This copper layer 1222 will ultimately serve as one electrode of the capacitor. The protective layer 1370 is removed after plating (FIG. 15) and discarded to yield a bimetal copper and aluminum foil having a very high surface area on the exposed aluminum side.

Figure 16:
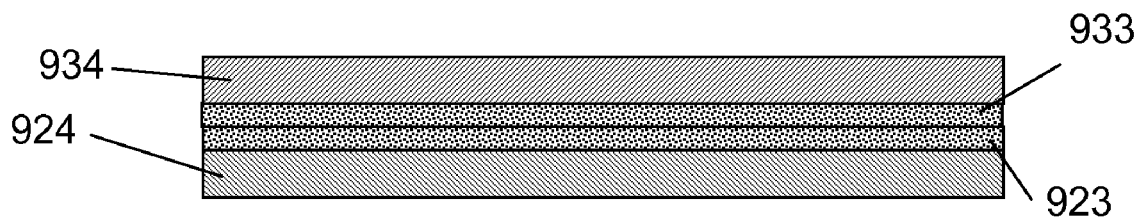
FIG. 16 is a cross sectional view of the separated foils of FIG. 11, after temporarily joining the treated surfaces together, in accordance with some embodiments of the invention.
Figure 17:
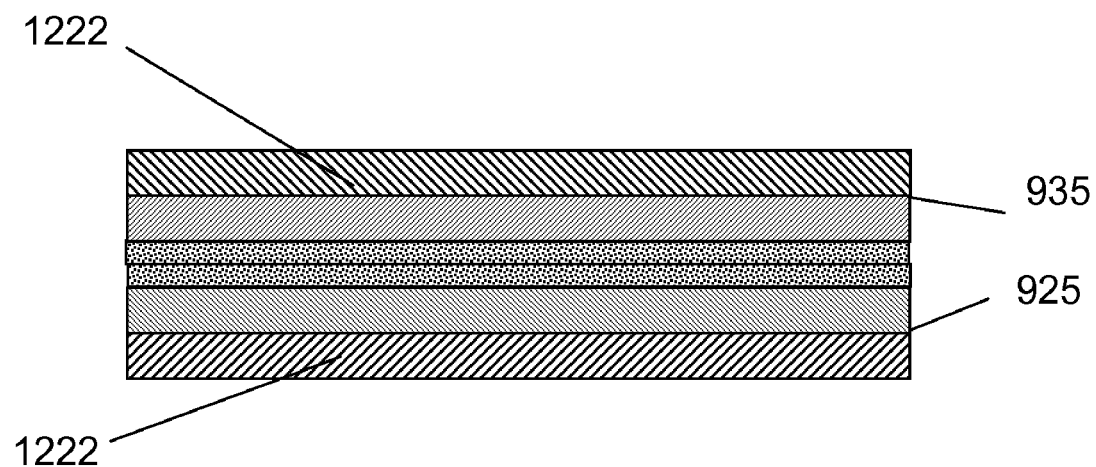
FIG. 17 is a cross sectional view of the joined foils of FIG. 16, after plating with copper, in accordance with some embodiments of the invention.
Figure 18:
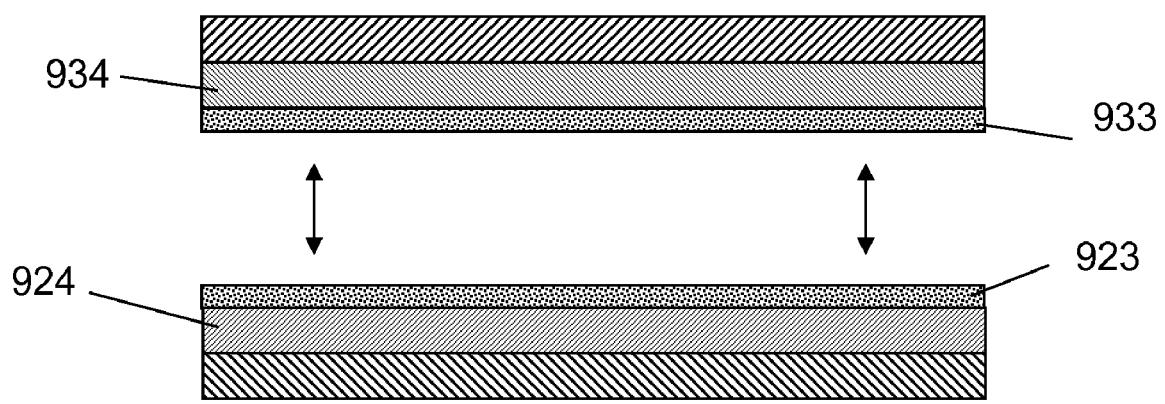
FIG. 18 is a cross sectional view of the plated foils of FIG. 17, after separating, in accordance with some embodiments of the invention.

In still another embodiment depicted in FIG. 16, after the two treated aluminum foils 924, 934 are separated from each other at the temporarily joined first major surfaces (FIG. 11), they are flipped over and joined together to form a sandwich so that the two treated surfaces 923, 933 face each other on the inside of the sandwich, in order to protect both treated surfaces from deposition during subsequent plating. The two treated aluminum foils may be attached at selected portions, such as the perimeter, by adhesive bonding, welding, or coining, etc. The attaching means used to temporarily hold the foils together is intentionally not depicted in the figure, as one skilled in the art will appreciate that any number of conventional attachment methods can be used, so long as the two foils can be cleanly separated at a later stage without damage to the treated high surface area aluminum surfaces. Referring now to FIG. 17, a layer of copper 1222 is plated on the exposed first surfaces 925, 935. Since the first surfaces were protected from attack during the treatment stage, they remain smooth and will yield a smooth plated surface. This copper layer 1222 will ultimately serve as one electrode of the capacitor. Referring now to FIG. 18, the two plated aluminum foils 924, 934 are separated from each other at the temporarily joined treated surfaces 923, 933. This can be accomplished in a number of ways, depending on how the foils were attached in the previous stage. If a weak adhesive or release layer was used, then the treated foils can simply be peeled apart. If they were joined at the perimeter, for instance, then the bonded perimeter area can be excised from the sandwich and discarded.

In summary, high capacitance value capacitors are formed using bimetal foils of an aluminum layer attached to a copper layer. The foil is temporarily attached to an identical foil or to a sacrificial aluminum carrier to form a sandwich, so that the copper layer is on the inside of the sandwich and the two aluminum layers are on the outside, sufficient to protect the copper layers from attack in a subsequent treatment. The exposed aluminum layers of the sandwich are then processed with a treatment that increases the surface area of the aluminum by at least one order of magnitude, and does not reveal any portion of the underlying copper layers. When the sandwich is separated, the treated bimetal foil can then be used to form a capacitor, where the copper layer is one electrode of the capacitor and the treated aluminum layer is in intimate contact with a dielectric layer of the capacitor.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

What is claimed is:

1. A method of forming a capacitor having a bimetal copper and aluminum structure, comprising:
   providing first and second bimetal foils, each comprising an aluminum layer attached to a copper layer;
   temporarily attaching the first bimetal foil copper layer to the second bimetal foil copper layer to form a sandwich, such that the aluminum layers of the sandwich are exposed, sufficient to protect the copper layers from attack in a subsequent treatment;
   treating the exposed aluminum layers of the sandwich in a manner sufficient to increase the surface area of each of the aluminum layers by at least one order of magnitude, and not reveal any of the underlying copper layers;
   separating, after treating, the first bimetal foil from the second bimetal foil; and
   forming the capacitor from one of the separated bimetal foils, wherein the copper layer is one electrode of the capacitor and the treated aluminum layer is in intimate contact with a dielectric layer of the capacitor.

2. The method of forming a capacitor as described in claim 1, wherein treating comprises wet chemical etching, electrochemical wet etching, laser etching, plasma etching, or chemical vapor deposition.

3. The method of forming a capacitor as described in claim 2, wherein treating comprises electrochemical wet etching using hydrochloric acid.

4. The method of forming a capacitor as described in claim 1, wherein the exposed aluminum layers of the sandwich are treated to form cavities that extend into each aluminum layer to a depth equal to at least 50% but not greater than 95% of the aluminum layer thickness.

5. The method of forming a capacitor as described in claim 1, wherein the exposed aluminum layers of the sandwich are treated to form cavities that extend into the aluminum layer to a depth equal to or greater than 17 microns.

6. The method of forming a capacitor as described in claim 1, wherein a portion of the separated bimetal foil is excised to form the capacitor.

7. The method of forming a capacitor as described in claim 1, wherein forming the capacitor further comprises laminating the separated bimetal foil into a printed circuit board.

8. The method of forming a capacitor as described in claim 1, further comprising anodizing the treated exposed aluminum layers of the sandwich.

9. The method of forming a capacitor as described in claim 1, wherein temporarily attaching comprises attaching the first bimetal foil copper layer to the second bimetal foil copper layer by means of a releasable interface.

10. The method of forming a capacitor as described in claim 9, wherein the releasable interface consists essentially of an admixture selected from the group consisting of chromium and chromium oxide, nickel and nickel oxide, chromium and chromium phosphate, nickel and nickel phosphate, and nickel and nickel chromate.

11. The method of forming a capacitor as described in claim 9, wherein separating comprises separating by means of the releasable interface.

12. The method of forming a capacitor as described in claim 1, wherein temporarily attaching comprises attaching the first bimetal foil copper layer to the second bimetal foil copper layer at a perimeter portion of each of the bimetal foils by adhesive means, by welding, or by coining.

13. The method of forming a capacitor as described in claim 12, wherein separating comprises separating by excising the attached perimeter portion.

14. A method of forming a capacitor having a bimetal copper and aluminum structure, comprising:
providing a bimetal foil comprising an aluminum layer attached to a copper layer;
providing a sacrificial aluminum carrier;
temporarily attaching the sacrificial aluminum carrier to the bimetal foil copper layer to form a sandwich, such that the aluminum layer and the sacrificial aluminum carrier are exposed, sufficient to protect the copper layer from attack in a subsequent treatment;
treating the exposed bimetal foil aluminum layer in a manner sufficient to increase the surface area of said aluminum layer by at least one order of magnitude and not reveal any of the underlying layer of copper;
forming a capacitor, wherein the copper layer is one electrode of the capacitor and the treated aluminum layer is in intimate contact with a dielectric layer of the capacitor; and
separating the treated bimetal foil from the sacrificial aluminum carrier.

15. The method of forming a capacitor as described in claim 14, wherein treating comprises wet chemical etching, electrochemical wet etching, laser etching, plasma etching, or chemical vapor deposition.

16. The method of forming a capacitor as described in claim 15, wherein treating comprises electrochemical wet etching using hydrochloric acid.

17. The method of forming a capacitor as described in claim 14, wherein temporarily attaching comprises attaching the sacrificial aluminum carrier to the bimetal foil copper layer by means of a releasable interface.

18. The method of forming a capacitor as described in claim 17, wherein the releasable interface consists essentially of an admixture selected from the group consisting of chromium and chromium oxide, nickel and nickel oxide, chromium and chromium phosphate, nickel and nickel phosphate, and nickel and nickel chromate.

19. The method of forming a capacitor as described in claim 17, wherein separating comprises separating by means of the releasable interface.

20. The method of forming a capacitor as described in claim 14, wherein temporarily attaching comprises attaching the sacrificial aluminum carrier to the bimetal foil copper layer at a perimeter of the bimetal foil by adhesive means, by welding, or by coining.

21. The method of forming a capacitor as described in claim 14, wherein the exposed aluminum layer of the sandwich is treated to form cavities that extend into the aluminum layer to a depth equal to at least 50% but not greater than 95% of the thickness of the aluminum layer.

22. The method of forming a capacitor as described in claim 14, wherein the sacrificial aluminum carrier is at least two times the thickness of the bimetal foil.

23. The method of forming a capacitor as described in claim 14, wherein forming the capacitor further comprises laminating the bimetal foil into a printed circuit board.

24. The method of forming a capacitor as described in claim 14, wherein a portion of the separated bimetal foil is excised to form the capacitor.

25. A method of forming bimetal copper and aluminum foil structure for embedding a capacitor in a printed circuit board, comprising:
providing a bimetal foil comprising an aluminum layer attached to a copper layer;
providing a protective foil layer, comprising a foil having at least an aluminum layer;
temporarily attaching the bimetal foil copper layer to the protective foil layer to form a sandwich, such that the aluminum layers of the sandwich are exposed, and sufficient to protect the copper layer from attack in a subsequent treatment;
treating the exposed aluminum layers of the sandwich to form deep pits in the bimetal foil aluminum layer sufficient to increase the surface area of the bimetal foil aluminum layer by at least one order of magnitude, and not reveal any of the underlying copper layer;
separating the bimetal foil from the protective foil layer; and
laminating the bimetal foil into a printed circuit board to form a capacitor, wherein the copper layer is one electrode of the capacitor and the treated aluminum layer is in intimate contact with a dielectric layer of the capacitor.

26. The method of forming a capacitor as described in claim 25, wherein treating comprises wet chemical etching, electrochemical wet etching, laser etching, plasma etching, or chemical vapor deposition.

27. The method of forming a capacitor as described in claim 26, wherein treating comprises electrochemical wet etching using hydrochloric acid.

28. The method of forming a capacitor as described in claim 25, wherein the deep pits extend into the aluminum layer to a depth equal to at least 50% but not greater than 95% of the thickness of the aluminum layer.

29. The method of forming a capacitor as described in claim 25, wherein the exposed aluminum layers of the sandwich are treated to form cavities that extend into the aluminum layer to a depth equal to or greater than 17 microns.

30. The method of forming a capacitor as described in claim 25, further comprising anodizing the treated exposed aluminum layers of the sandwich.

31. The method of forming a capacitor as described in claim 25, wherein temporarily attaching comprises attaching the bimetal foil copper layer to the protective foil layer by means of a releasable interface.

32. The method of forming a capacitor as described in claim 31, wherein the releasable interface consists essentially of an admixture selected from the group consisting of chromium and chromium oxide, nickel and nickel oxide, chromium and chromium phosphate, nickel and nickel phosphate, and nickel and nickel chromate.

33. The method of forming a capacitor as described in claim 25, wherein temporarily attaching comprises attaching the first bimetal foil copper layer to the second bimetal foil copper layer at a perimeter portion of each of the bimetal foils by adhesive means, by welding, or by coining.

34. The method of forming a capacitor as described in claim 33, wherein separating comprises separating by excising the attached perimeter portion.

35. A method of forming a capacitor having a bimetal copper and aluminum structure, comprising:
providing first and second aluminum foils, each comprising a first surface and an opposing second surface;
temporarily attaching the first surface of the first aluminum foil to the first surface of the second aluminum foil in a manner sufficient to protect both first surfaces from attack during a subsequent treatment, and such that the second surfaces of both foils are exposed;
treating the exposed second surfaces of both aluminum foils in a manner sufficient to increase the surface area by at least one order of magnitude;
separating, after treating, the first aluminum foil from the second aluminum foil;

plating, after separating, copper on the first surface of the aluminum foils to create one or more bimetal foils; and forming the capacitor from the one or more bimetal foils, wherein the plated copper is one electrode of the capacitor and the treated second surface is in intimate contact with a dielectric layer of the capacitor.

36. The method of forming a capacitor of claim 35, further comprising:

providing a protective layer;

before plating, temporarily attaching the protective layer to the treated second surface, sufficient to prevent copper deposition on the treated second surface during plating;

separating, after plating, the protective layer from the bimetal foil.

37. The method of forming a capacitor of claim 35, further comprising:

after separating and before plating, temporarily attaching the treated second surface of the first aluminum foil to the treated second surface of the second aluminum foil in a manner sufficient to protect both treated second surfaces from deposition during subsequent plating, and such that the first surfaces of both foils are exposed; and after plating, separating the treated second surface of the first aluminum foil from the treated second surface of the second aluminum foil.

38. The method of forming a capacitor as described in claim 35, wherein treating comprises wet chemical etching, electrochemical wet etching, laser etching, plasma etching, or chemical vapor deposition.

39. The method of forming a capacitor as described in claim 38, wherein treating comprises electrochemical wet etching using hydrochloric acid.

40. The method of forming a capacitor as described in claim 35, wherein the exposed second surfaces are treated to form cavities that extend into each aluminum foil to a depth equal to at least 50% but not greater than 95% of the aluminum foil thickness.

41. The method of forming a capacitor as described in claim 35, wherein the exposed second surfaces are treated to form cavities that extend into the aluminum foil to a depth equal to or greater than 17 microns.

42. The method of forming a capacitor as described in claim 35, wherein a portion of the separated bimetal foil is excised to form the capacitor.

43. The method of forming a capacitor as described in claim 35, wherein forming the capacitor further comprises laminating the separated bimetal foil into a printed circuit board.

44. The method of forming a capacitor as described in claim 35, further comprising anodizing the treated exposed second surfaces.

45. A method of forming a capacitor having a bimetal copper and aluminum structure, comprising:

providing an aluminum foil having a first surface and an opposing second surface;

protecting the first surface of the aluminum foil sufficient to prevent degradation during a subsequent surface modification treatment, and such that the second surface of the foil is exposed;

modifying the exposed second surface of the aluminum foil in a manner sufficient to increase the surface area by at least one order of magnitude;

unprotecting the first surface of the aluminum foil;

providing a layer of copper on the aluminum foil first surface to create a bimetal foil; and after unprotecting, forming the capacitor from the modified bimetal foil, wherein the layer of copper is one electrode of the capacitor and the modified second surface is in intimate contact with a dielectric layer of the capacitor.

46. The method of forming a capacitor as described in claim 45, wherein forming the capacitor further comprises adding a second electrode and excising a portion of the bimetal foil to form the capacitor.

47. The method of forming a capacitor as described in claim 45, wherein forming the capacitor further comprises laminating the bimetal foil into a printed circuit board.

48. The method of forming a capacitor as described in claim 45, wherein the first surface of the aluminum foil is protected with a copper foil or an aluminum foil.

49. The method of forming a capacitor as described in claim 45, wherein providing a layer of copper comprises plating copper.

50. The method of forming a capacitor as described in claim 45, wherein providing a layer of copper comprises bonding a layer of copper.

* * * * *